United States Patent [19]

Nomura et al.

[11] Patent Number: 5,117,272
[45] Date of Patent: May 26, 1992

[54] HAVING A PROTECTIVE FILM OF A POLYMER HAVING A FLUORINE-CONTAINING ALIPHATIC CYCLIC STRUCTURE

[75] Inventors: Shinzou Nomura, Shiga; Hiroshi Katsushima, Sagamihara; Toru Kawasaki, Ichihara; Masao Unoki, Yokohama; Masaru Nakamura, Tokyo, all of Japan

[73] Assignees: Asahi Glass Company Ltd., Tokyo; NMB Semiconductor Co., Ltd., Tateyama, both of Japan

[21] Appl. No.: 509,144

[22] Filed: Apr. 16, 1990

[30] Foreign Application Priority Data

Apr. 19, 1989 [JP] Japan ................ 1-97650
Feb. 26, 1990 [JP] Japan ................ 2-42479

[51] Int. Cl.$^5$ ............... H01L 29/34; H01L 23/28
[52] U.S. Cl. ............................... 357/52; 357/54; 357/72
[58] Field of Search ........................ 357/52, 72, 54

[56] References Cited

U.S. PATENT DOCUMENTS

| 4,933,305 | 7/1990 | Kikkawa | 357/72 |
| 4,977,199 | 12/1990 | Koleske et al. | 528/361 |
| 4,980,268 | 12/1990 | Bartmann et al. | 430/283 |

FOREIGN PATENT DOCUMENTS

| 0139924 | 5/1985 | European Pat. Off. | 357/72 |
| 1764738 | 9/1970 | Fed. Rep. of Germany | 357/52 |
| 61-154151 | 7/1986 | Japan | 357/72 |
| 2097999 | 11/1982 | United Kingdom | 357/72 |

OTHER PUBLICATIONS

K. Sato et al., "A Novel planar multilevel interconnection technology utilizing polyimide", *IEEE Transaction on Parts, Ayamds and Packaging*, vol. PHP-9 (Sep. 1973), pp. 176-180.

Patent Abstracts of Japan, vol. 13, No. 278 (C-611) 26 Jun. 1989, & JP-A-01 075575 (Honny Chem Ind Co. Ltd.) 22 Mar. 1989.

Patent Abstracts of Japan, vol. 12, No. 20 (E-575) (2867) 21 Jan. 1988, & JP-A-62 177950 (Hitachi) 01 Aug. 1987.

*IEEE Transactions on Electron Devices*, vol. ED-26, No. 1, Jan. 1979, New York US pp. 77-83; A. Christo et al.: "Reliability of hybrid encapsulation based on fluorinated polymeric materials" p. 78, Para. A.

*Primary Examiner*—J. Carroll
*Attorney, Agent, or Firm*—Oblon, Spivak, McClelland, Maier & Neustadt

[57] ABSTRACT

A semiconductor integrated circuit device having a protective film made of a polymer having a fluorine-containing aliphatic cyclic structure.

23 Claims, 3 Drawing Sheets

HAVING A PROTECTIVE FILM OF A POLYMER HAVING A FLUORINE-CONTAINING ALIPHATIC CYCLIC STRUCTURE

The present invention relates to a semiconductor integrated circuit device having a protective film made of a fluorine-containing polymer having a cyclic structure in its main chain.

Semiconductor devices constituted by e.g. N channel MOS, P channel MOS, CMOS, Bi-CMOS or bipolar, are used in typical semiconductor integrated circuit devices such as DRAM (dynamic ram: a memory refreshing action required), SRAM (static ram: a memory no refreshing action is required), EEPROM (writable, readable and a memory not destroyed even when the power is off) and FRAM (ferroelectric ram: a ferroelectric film is used). In such semiconductor devices, protective films such as a buffer coat film, an α-ray shielding film, a passivation film, an exterior sealing material (molding material) and an interlayer insulating film, are fabricated and used. Among them, the α-ray shielding film is provided to protect the chip from α-rays generated from the packaging material of the semiconductor device or from α-rays generated naturally. The passivation film is provided to prevent the intrusion of moisture or impurities into the chip. The buffer coat film serves as a film for buffering a mechanical stress due to the assembled materials. As the exterior sealing material, an epoxy resin (molding material) is used.

Polyimide-type resins are used for such protective films including an α-ray shielding film, since a high level of electrical insulating properties is required and heat resistance is required for a sealing resin to be durable at a transfer-molding temperature. However, such resins are usually insoluble in usual solvents and can hardly be formed into thin films. Therefore, it has been common to employ a method wherein a solution of a polyimide precursor is coated and subjected to heat treatment at a temperature of from 180 to 400° C., so that the precursor is converted to a polyimide by a dehydration ring-closure reaction. However, such a method has a problem that due to the dehydration reaction, the volume shrinkage, stress formation and moisture residual are likely to result, thus leading to a degradation of the properties of the semiconductor. On the other hand, an epoxy resin and a filler have been used as a molding material for the external sealing material. However, due to the external stress (an external stress of at least $5\times10^9$ dyn/cm$^2$) against the semiconductor device, a degradation of the properties of the semiconductor device has become remarkable.

In order to overcome such a problem, it has been attempted to compound a stress-reducing agent. However, a failure due to a local concentration of pressure by the filler has been detected. Under the circumstances, a low stress material has been desired for the external sealing material. If the dielectric constant or the water absorptivity of the protective film is large, the speed performance of the device tends to be poor, or the response speed tends to be slow. Therefore, a material having a still lower dielectric constant has been desired for further reducing the size of the device or for increasing the density of the device.

It is an object of the present invention to solve the above mentioned drawback observed in the protective films for semiconductor integrated circuit devices, made of conventional materials and to provide a novel semiconductor integrated circuit device having a protective film having a low water absorptivity and a very low dielectric constant.

For example, the properties required for a thin film to be used as an interlayer insulating film formed at a temperature of up to 400° C., include flatness and step coverage, low particle and pinhole densities, high electrical stress resistance, a low leakage current, a low stress, a low dielectric constant, moisture resistance, radiation damage freeness, ION freeness, good adhesion to TiN and TiW, low reactivity with TiN and TiW, low hillock generation, low annealing shrinkage and crack freeness. As such interlayer insulating films, there have been developed $SiO_2$, PSG, $SiN_x$, $SiO_xN_y$, BSG and BPSG as conventional CVD insulating films, and low temperature CVD techniques have been employed. As a result of a research by the present inventors, it has been found that by using a certain specific fluorine-containing polymer which will be described hereinafter, it is possible to obtain an interlayer insulating film which has substantially equal properties as a coated glass film (SOG inclusive of inorganic SOG, organic SOG and doped glass) and which is excellent in the step coverage properties.

Further, the properties required for a thin film to be used as an interlayer insulating film formed at a temperature of up to 350° C., include flatness and step coverage, low particle and pinhole densities, high electrical stress resistance, a low leakage current, a low stress, a low dielectric constant, moisture resistance, radiation damage freeness, ION freeness, good adhesion to Al, low reactivity with Al, low hillock formation, a low annealing shrinkage and crack freeness. As such interlayer insulating-films, there have been developed $SiO_2$, PSG, $SiN_x$, $SiO_xN_y$, BSG and BPSG as conventional CVD insulating films, and low temperature CVD techniques have been employed. In the same manner as mentioned above, it has been found that by using a certain specific fluorine-containing polymer as described hereinafter, it is possible to obtain an interlayer insulating film which has substantially the same properties as a coated glass layer (SOG inclusive of inorganic SOG, organic SOG and doped glass) and which is excellent in the flatness and step coverage properties.

Figure 5:
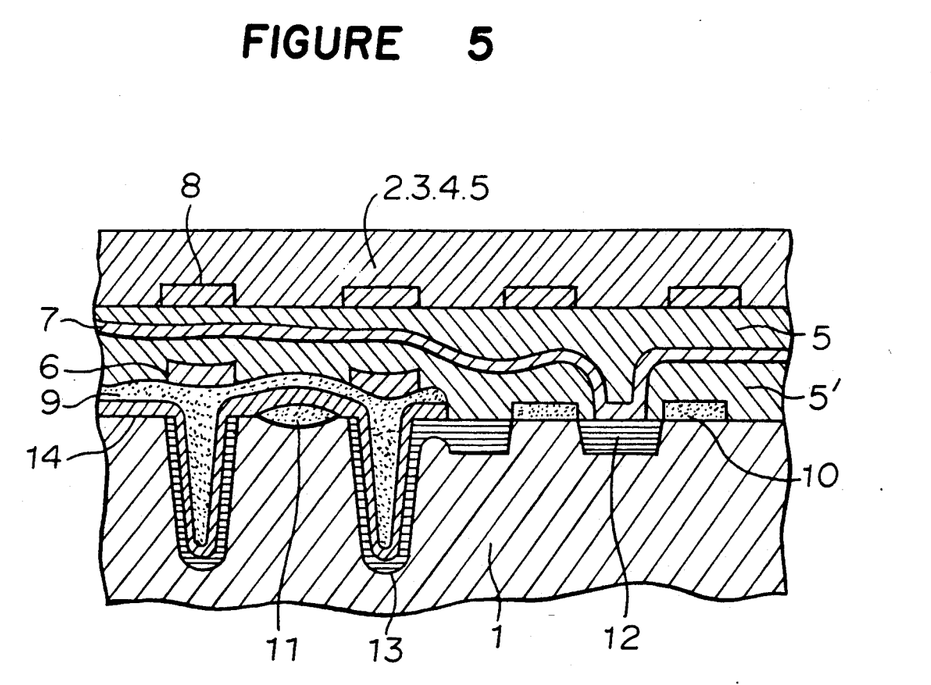
FIG. 5 illustrates a semiconductor integrated circuit device according to Examples 7 and 8.

FIG. 5 in the accompanying drawings illustrates an application example for the above mentioned interlayer insulating film. FIG. 5 is an enlarged cross sectional view of a semiconductor device, wherein reference numeral 1 indicates a silicon substrate, numerals 2, 3 and 4 indicate a buffer coat film, an α-ray shielding film or a passivation film, numeral 5 and 5' indicate interlayer insulating films made of a specific fluorine-containing polymer of the present invention, numerals 6 to 8 indicate metal wiring materials of the first to third layers, numerals 9 and 10 indicate insulating films such as silicon oxide films, numeral 11 indicates a separating insulating film, numeral 12 indicates a field effect transistor electrode 1, numeral 13 indicates a silicon electrode for a memory device, and numeral 14 indicates an insulating film for a memory device such as a silicon oxide film or a $Si_3N_4$ film.

The present inventors have conducted extensive researches in recognition of the above problems. As a result, they have found that on the basis of the above mentioned discovery, the polymer having a fluorine-containing aliphatic cyclic structure is extremely advantageous as a material having very low water-absorptivity, a low dielectric constant and high electrical insulating properties and heat resistance and capable of providing a protective film for a semiconductor to satisfy the above requirements.

Thus, the present invention has been accomplished on the basis of the above discoveries and provides a semiconductor integrated circuit device having a protective film made of a polymer having a fluorine-containing aliphatic cyclic structure.

Now, the present invention will be described in detail with reference to the preferred embodiments.

In the present invention,-the polymer having a fluorine-containing aliphatic cyclic structure includes a wide range of such polymers including known or well known polymers. Thus, in the present invention, a fluorine-containing polymer having the above specified cyclic structure in its main chain is preferably employed.

For example, those having the following cyclic structures may be mentioned:

wherein l is from 0 to 5, m is from 0 to 4, n is 0 or 1, provided that l+m+n is from 1 to 6, and R is F or CF$_3$;

wherein each of o, p and q is from 0 to 5, provided o+p+q s from 1 to 6; and wherein R$_1$ is F or CF$_3$, and R$_2$ is F or CF$_3$. Among these, polymers having the following cyclic structures are representative. However, the-present invention is by no means restricted to such specific examples.

-continued

The following two processes may be mentioned for the preparation of these polymers. However, the process is for their preparation are not limited to such specific examples 1. By Cyclic Polymerization (1) CF$_2$=CF—O—CF$_2$—CF$_2$—O—CF=CF$_2$ (e.g. USP 3,418,303 and GB 1,106,344)

(2) CF$_2$=CF—CF$_2$—CFCl—CF$_2$—CF=CF$_2$

(e.g. USP 3,202,643)

(3) CF$_2$=CF—O—CF$_2$—CF=CF$_2$

2. By Means of a Cyclic Monomer Such as Perfluoro-2,2-Dimethyl-1,3-Dioxol (U.S. Pat. No. 3,978,030 and 4,754,009)

radical polymerization

Exemplified above are polymers having a perfluoro aliphatic cyclic structure. However, in the present invention, those having a part of fluorine atoms of the above exemplified polymers substituted by other hydrogen atoms or organic groups, or those having a cyclic structure such as obtainable by metathesis polymerization, may also be employed.

Thus, the polymer having a specific cyclic structure of the present invention can readily and advantageously be obtained by the cyclic polymerization as described above. In particular, by using a monomer which has two polymerizable groups having different polymerizabilities in the molecule and wherein the straight chain portion of the linking chain connecting the two polymerizable groups has from 2 to 7 atoms, the cyclic polymerization can be proceeded smoothly and advantageously while suppressing a side reaction for gelation even without employing super high pressure conditions or highly diluted conditions.

As a monomer suitable for such cyclic polymerization, it is firstly desired that the monomer has two carbon-carbon multiple bonds which are different in the polymerizability. Usually, carbon-carbon double bonds are employed. Two multiple bonds differing in the types or in the structures, are employed. For example, there may be employed a fluorine-containing monomer having two multiple bonds having asymmetrical structures, a monomer having a vinyl group and an allyl group, a monomer having a vinyl ether group and a vinyl group, a monomer having a fluorine-containing multiple-bond and a hydrocarbon multiple bond and a monomer having a perfluoro multiple bond and a partially fluorinated multiple bond. Secondly, the straight chain portion of the linking chain connecting such two carbon-carbon multiple bonds, has from 2 to 7 atoms. When the straight chain portion of the linking chain has 0 or one atom, the cyclic polymerization will hardly take place. The same is true also in a case where the straight chain portion has 8 or more atoms. Usually, this number of atoms is preferably from 2 to 5. The linking chain is not limited to a straight chain and may have a side chain structure or a cyclic structure. Further, the constituting atoms are not limited to carbon atoms and may contain hetero atoms such as O, S, N. Thirdly, the fluorine content of the resulting polymer is preferably at least 30% by weight. If the fluorine content is too small, the specificity of fluorine atoms tends to hardly be obtained. Of course, a perfluoro monomer is suitably employed.

The above mentioned specific fluorine-containing monomer includes the following specific monomers:

—continued

In the present, a monomer having one vinyl ether group of $CF_2=CFO-$ is preferably employed from the viewpoint of the polymerization reactivity, the cyclic polymerizability and the suppression of gelation. Particularly, perfluoroallyl vinyl ether $(CF_2=CFOCF_2CF=CF_2)$ and perfluorobutenyl vinyl ether $(CF_2=CFOCF_2CF_2CF=CF_2)$ may be mentioned as preferred monomers.

The above mentioned monomers may be used alone or in combination as a mixture of two or more. Further, these components may be used and copolymerized with other copolymer components so long as the essential nature thereof will not thereby be impaired. If necessary, the polymer may be cross-linked by some method.

Other monomers to be copolymerized are not particularly limited so long as they are monomers having radical polymerizability, and they cover a wide range of monomers including those of a fluorine-containing type, a hydrocarbon containing type, etc. Of couse, these other monomers may be radical-copolymerized alone to the above mentioned monomer capable of introducing the specific cyclic structure, or two or more appropriate types thereof may be used in combination for the above mentioned copolymerization reaction. In the present invention, it is usually preferred to select as such other monomers fluorine-containing monomers such as fluoroolefins or fluorovinyl ethers. For example, tetrafluoroethylene, perfluoromethyl vinyl ether, perfluoropropyl vinyl ether or perfluoro vinyl ether having a functional group such as a carboxylic acid group or a sulfonic acid group, may be mentioned as preferred examples. Further, vinylidene fluroide, vinyl fluoride or chlorotrifluoroethylene may also be mentioned.

As the copolymer composition, in order to obtain the characteristics of the specific fluorine-containing aliphatic cyclic structure for the purpose of the present invention, the composition of the cyclic structure is preferably at least 20 mol %, more preferably at least 40 mol %.

In the present invention, as a method for cross-linking the fluorine-containing polymer, a method which is commonly used may suitably be employed. For example, a monomer having a cross-linking site may be copolymerized for cross-linking, a cross-linking agent may be added for cross-linking, or radiation may be employed for cross-linking.

Further, to the fluorine-containing polymer of the present invention, it is possible to incorporate various additives such as an antioxidant and an ultra violet stabilizer in order to improve the practical usefulness.

The polymer having the specific cyclic structure of the present invention is soluble in e.g. a fluorine-type solvent, and can be formed into a thin protective film by e.g. cast molding from a solution. Further, as a thermoplastic resin, it has a low melting point and a relatively low melt viscosity. Therefore, hot melt molding can readily be conducted.

The solvent to be used is not limited so long as it is capable of dissolving the above polymers. However, perfluorobenzene, perfluoro(2-buthyltetrahydrofuran), perfluoro(tributylamine), "Afluid" (trade name for a fluorine-type solvent, manufactured by Asahi Glass Company limited), "Fluorinert" (trade name for a liquid containing perfluoro(2-butyltetrahydrofuran), manufactured by 3M Company) and trichlorotrifluoroethane may suitably be employed. Of course, it is possible to use a suitable combination of two or more solvents. In the case of a solvent mixture, a hydrocarbon type, a chlorinated hydrocarbon, a fluorochlorinated hydrocarbon, an alcohol and other organic solvents may be used in combination. The concentration of the solution is usually from 0.01 to 50% by weight, preferably from 0.1 to 20% by weight.

In the present invention, the polymer having a fluorine-containing aliphatic cyclic structure has a little or no substantial crystallinity. Therefore, despite the fact that it is a fluorine resin, it has a solubility to a certain solvent and is capable of forming a uniform thin film by coating. Further, since it is a fluorine-containing polymer, it is superior to usual hydrocarbon resins in the moisture resistance and chemical resistance, and it has a very low dielectric constant and high electrical insulating properties, and its heat decomposition temperature is extremely high. However, it should be understood that such a description is intended to help understand the present invention and by no means restrict the present invention.

Now, the present invention will be described in further detail with reference to Examples. However, it should be understood that the present invention is by no means restricted by such specific Examples. PREPARATION EXAMPLE 1

35 g of perfluoroallyl vinyl ether, 5 g of trichlorotrifluoroethane (hereinafter referred to simply as R-113), 150 g of deionized water and 35 mg of as a polymerization initiator, were introduced into a pressure resistant glass autoclave having an internal capacity of 200 ml. The interior of the system was flushed three times with nitrogen, and then suspension polymerization was conducted at 26° C. for 23 hours, to obtain 28 g of a polymer.

The infrared absorption spectrum of this polymer was measured, whereby no absorption was observed at about 1,660 cm$^{-1}$ (kayzer) and 1,840 cm$^{-1}$ (kayzer) attributable to a double bond as observed with the monomer. This polymer was dissolved in perfluorobenzene, and the $^{19}$F NMR spectrum was measured to obtain a spectrum showing the following repeating structure:

The specific viscosity [$\eta$] of this polymer was 0.530 as measured at 30° C. in "Fluorinert" FC-75 (trade name for a liquid containing perfluoro(2-butyltetrahydrofuran) as the main component, manufactured by 3M Company, hereinafter referred to simply as FC-75). The glass transition temperature of the polymer was 69° C., and it was a glass-like polymer which was tough and transparent at room temperature. Its 10% heat decomposition temperature was 462° C. The water absorptivity was not more than 0.01%, and the dielectric constant at room temperature was 2.1 (60 Hz to 1 MHz). The volume resistivity was at least 10$^{17}$.

PREPARATION EXAMPLE 2

20 g of 1,1,2,4,4,5,5-heptafluoro-3-oxa-1,6-heptadiene and 40 g of R-113 were introduced into a three-necked flask flushed with nitrogen, and 20 mg of was added thereto as a polymerization initiator. The interior of the system was flushed with nitrogen, and the polymerization was conducted at 18° C. for 10 hours, to obtain 10 g of a polymer. This polymer was a polymer soluble in R-113, and the specific viscosity [$\eta$] was 0.96 as measured at 30° C. in m-xylenehexafluoride. By the $^1$H NMR, it was confirmed to be a polymer having a cyclic structure on its backbone chain. The water absorptivity of this polymer was not more than 0.01%, and the dielectric constant at room temperature was 2.1 (60 Hz to 1 MHz). The volume resistivity was at least 10$^{17}$.

PREPARATION EXAMPLE 3

35 g of perfluorobutenyl vinyl ether, 5 g of R-113, 150 g of deionized water and 50 mg of diisopropyl peroxydicarbonate as a polymerization initiator were introduced into a pressure resistant glass autoclave having an internal capacity of 200 ml. The interior of the system was flushed three-times with nitrogen, and then suspension polymerization was conducted at 40° C. for 23 hours, to obtain 28 g of a polymer.

The infrared absorption spectrum of this polymer was measured, whereby there was no absorption observed at about 1660 cm$^{-1}$ (kayser) and 1850 cm$^{-1}$ (kayser) attributable to a double bond as observed with the monomer. This polymer was soluble in perfluorobenzene, perfluoro(2-butyltetrahydrofuran), perfluoro(tributylamine), "Afluid" (trade name) and "Fluorinert" (trade name). Further, the $^{19}$F NMR spectrum was measured, whereby a spectrum corresponding to a cyclic structure was obtained, as in Preparation Example 1. The specific viscosity [$\eta$] of this polymer was 0.50 as measured at 30° C. in FC-75. The glass transition temperature of this polymer was 110° C., and it was a glass-like polymer which was tough and transparent at room temperature. Its 10% heat decomposition temperature was 466° C. The water absorptivity was not more than 0.01%, and the dielectric constant at room temperature was 2.2 (60 Hz to 1 MHz). The volume resistivity was at least $10^{17}$.

EXAMPLE 1

The fluorine-containing polymer obtained in Preparation Example 1 was dissolved in FC-75 to obtain a 5%, 7% or 9% solution. This solution was coated on a semiconductor device (CMOS-DRAM), and the solvent was vaporized at a temperature of from 65° to 185° C. This operation was repeated a few times to form a transparent defect-free uniform thin film (a buffer coat film) having a thickness of from 30 to 50 μm.

Figure 1:
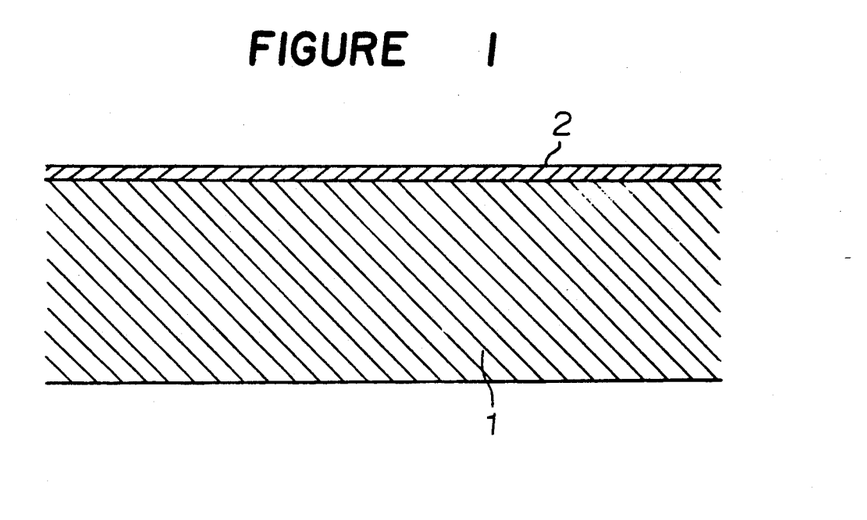
FIG. 1 illustrates a semiconductor integrated circuit device according to Examples 1 to 3.

FIG. 1 of the accompanying drawings shows a diagrammatical view of the cross section of the semiconductor device having the thin film formed by the above operation. In FIG. 1, reference numeral 1 indicates a silicon substrate having a various functional layers formed thereon, and numeral 2 indicates the buffer coat film composed of the fluorine-containing polymer. The semiconductor device showed no substantial change in the operational properties as compared with the properties prior to the formation of the thin film. Further, since the above thin film had an extremely low water absorptivity, no penetration of moisture through the thin layer to the chip was observed, and no corrosion of the aluminum patterning was observed for a long period of life test.

EXAMPLE 2

Using the fluorine-containing polymer obtained in Preparation Example 2, a thin film having a thickness of about 40 μm was formed on a semiconductor device in the same manner as in Example 1. As a result, a semiconductor device (see FIG. 1) having a uniform and defect-free protective film and excellent properties, was obtained as in Example 1.

EXAMPLE 3

Using the fluorine-containing polymer obtained in Preparation Example 3, a thin film having a thickness of 50 μm was formed on a semiconductor device in the same manner as in Example 1. As a result, a semiconductor device (see FIG. 1) having a uniform and defect-free protective film and excellent properties, was obtained as in Example 1.

EXAMPLE 4

A fluorine-containing copolymer comprising 26 mol % of tetrafluoroethylene and 74 mol % of perfluoro-2,2-dimethyl 1,3-dioxol, was dissolved in perfluoro(tributylamine) to obtain a 5% solution. A thin film having a thickness of 20 μm was formed on a semiconductor device in the same manner as in Example 1 except that this solution was used. As a result, a semiconductor device (see FIG. 1) having a uniform and defect-free protective film and excellent properties, was obtained as in Example 1.

EXAMPLE 5

The fluorine-containing polymer obtained in Preparation Example 3 was dissolved in perfluoro(tributylamine) to obtain a 5%, 7% or 9% solution. This solution was coated on a semiconductor device (CMOS-DRAM) by potting, and the solvent was vaporized at a temperature of from 65° to 185° C. This operation (baking and curing) was repeated a few times to form a transparent, defect-free and uniform thin film having a thickness of 30 μm, 40 μm or 50 μm.

Figure 2:
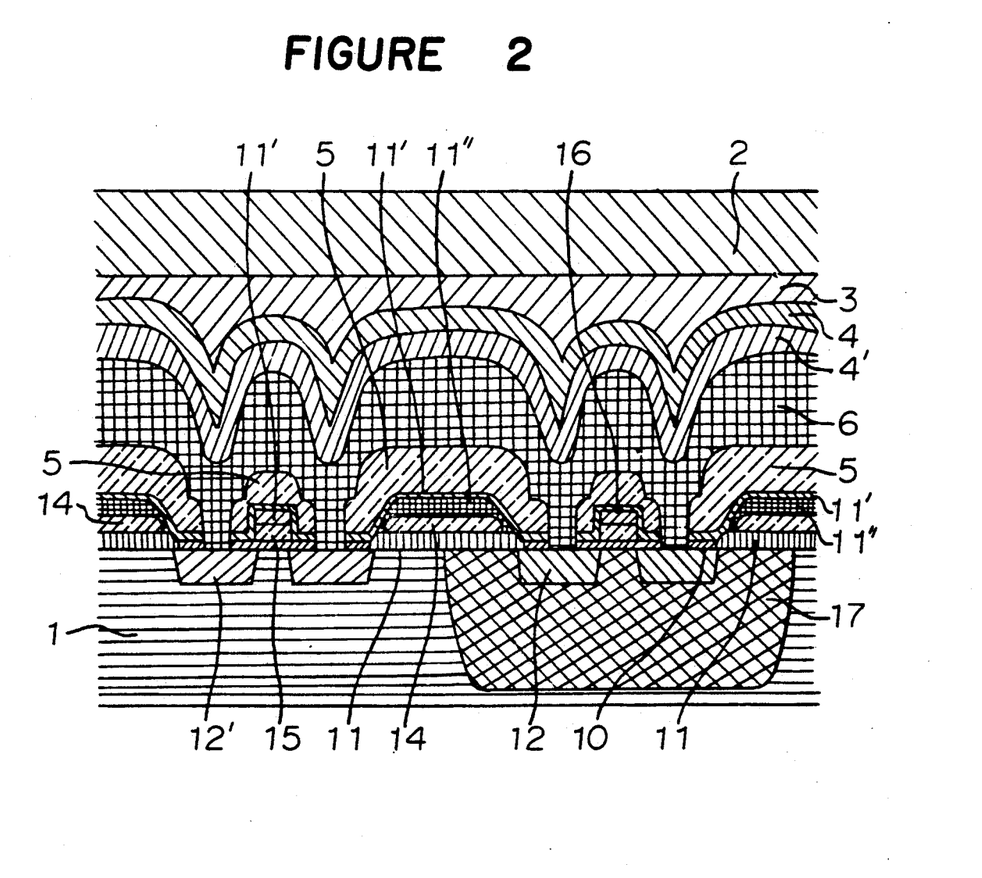
FIG. 2 illustrates a semiconductor integrated circuit device according to Example 5.

FIG. 2 of the accompanying drawings shows the semiconductor device having the thin film formed by the above operation. FIG. 2 is an enlarged cross sectional view of the semiconductor device, wherein reference numeral 1 indicates a silicon substrate, numeral 2 indicates a buffer coat film made of the fluorine-containing polymer, numeral 3 indicates an α-ray shielding film made of the fluorine-containing polymer, numerals 4 and 4' indicate a passivation film 1 and a passivation film 2, respectively, numeral 5 indicates an interlayer insulating film, numeral 6 indicates a metal wiring layer, numeral 10 indicates an insulating film such as a silicon oxide film, or an insulating film for separating or controlling an active device, numeral 11 is an insulating film for isolating or controlling an active device such as a silicon oxide film, numeral 11' indicates a isolating insulating film, numeral 11" indicates an insulating film, numerals 12 and 12' indicate field effect transistor electrodes 1 and 2, respectively, and numerals 14 and 15 indicate polycrystal silicon films, numeral 16 indicates a gate metal film for control made of a W/Si alloy or a Ti/Si alloy, and numeral 17 indicates an N-type or P-type well for CMOS.

With the film made of the flourine-containing polymer of the present invention, little degradation was observed within the operational range.(particularly the power supply, and marginal voltage) as compared with a polyimide resin film, and good results were obtained. Further, as the thin film of the present invention had an extremely low water absorptivity, no penetration of water through the thin film to the chip was observed. Good results as compared with the conventional polyimide resin film, were obtained also in the high temperature high humidity test and in the long duration reliability test (the high temperature operation test). Further, the evaluation of the thin film as an α-ray shielding film was conducted by an α-ray acceleration test using an α-ray generating apparatus "$AM^{241}$" (trade name), and good results were obtained as compared with a polyimide resin film. In order to introduce to a mass production line (for example, a DRAM line), a dispenser and a needle for a fluorine-containing polymer solution, were used.

EXAMPLE 6

The fluorine-containing polymer obtained in Preparation Example 3 was dissolved in perfluoro(tributylamine) to obtain a 5%, 7% or 9% solution. This solution was coated on a semiconductor device (CMOS-DRAM) (i.e. over the entire surface of a 5 inch wafer or a 6 inch wafer) by a spin coater, and the solvent was vaporized at a temperature of from 65 to 185° C. (baking and curing) to obtain a transparent, defect-free (no pinhole) and uniform thin film having a thickness 1 μm, 2 μm, 3 μm or 5 μm. Thereafter, it was subjected to pre-baking (185° C.–220° C.) for 30 seconds and coating of a solvent for improving adhesion, followed by coating with a photoresist, baking, exposure and a process, and then formation of a thin film as a passivation film and etching evaluation which is essential for fine processing.

Figure 3:
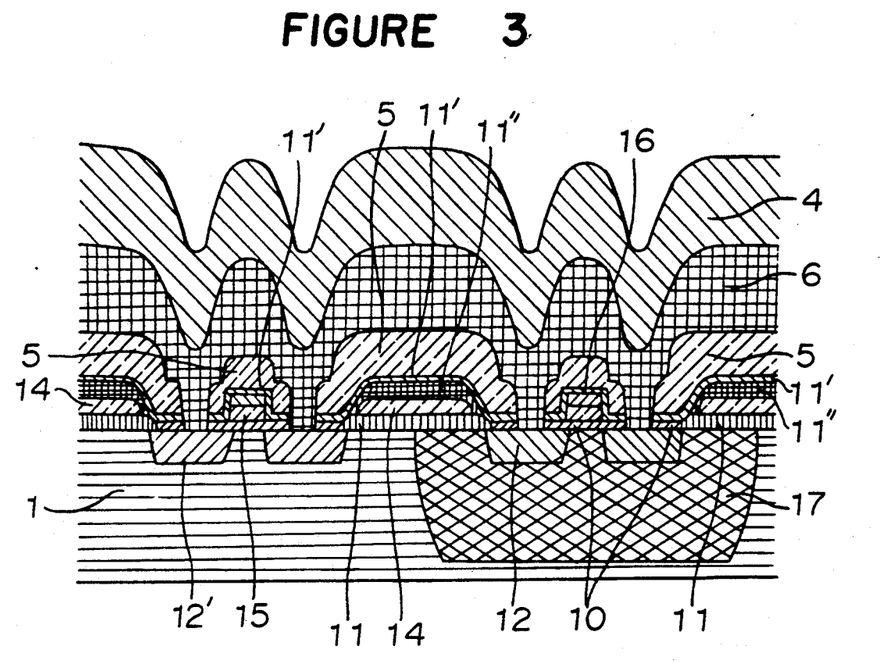
FIGS. 3 and 4 illustrate a semiconductor integrated circuit device according to Example 6.
Figure 4:
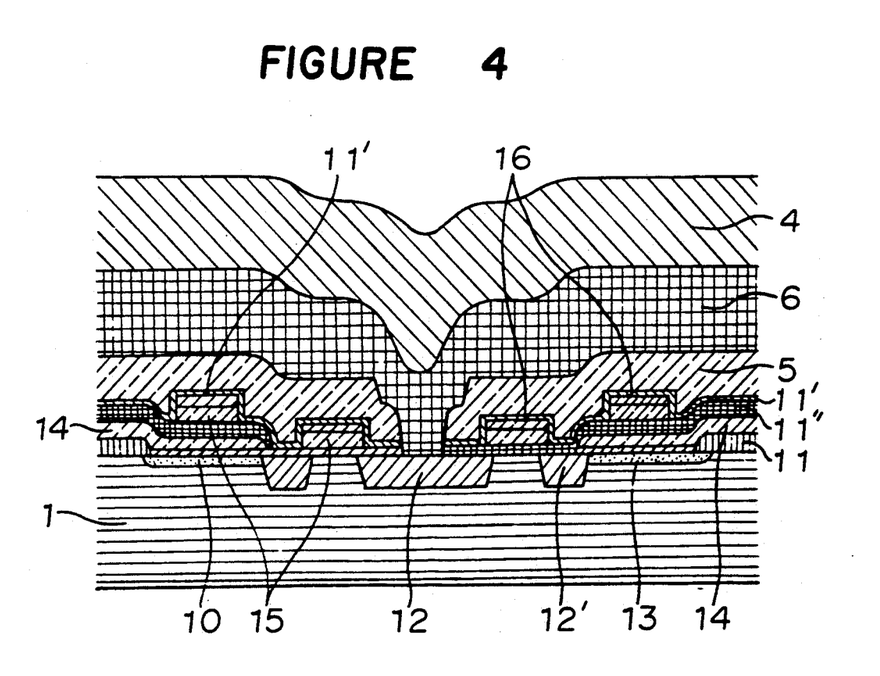

The semiconductor devices of this Example are shown in FIGS. 3 and 4 in the accompanying drawings. Both FIGS. 3 and 4 are enlarged cross sectional views of the semiconductor devices, wherein reference numeral 1 indicates a silicon substrate, numeral 4 indicates a passivation film composed of the fluorine-containing polymer, numeral 5 indicates an interlayer insulating film, numeral 6 indicates a metal patterning layer, numeral 10 indicates an insulating film for a gate such as silicon oxide film, or an insulating film for a memory device such as a $SiO_2$ film or a $Si_3N_4$ film, numeral 11 indicates an insulating film for isolating a memory device such as a silicon oxide film, numeral 11' indicates a isolating insulating film such as a $Si_3N_4$ film, numeral 11" indicates a isolating insulating film such as a $SiO_2$ film or a $Si_3N_4$ film, numerals 12 and 12' indicate field effect transistor electrodes 1 and 2, respectively, numeral 13 indicates a silicon electrode for a memory device, numerals 14 and 15 indicate polycrystal silicon films or polycrystal silicon electrodes for memory devices, numeral 16 indicates a 5 gate metal film for control made of a W/Si alloy or a Ti/Si alloy, and numeral 17 indicates an N-type or P-type well for CMOS.

With respect to the above semiconductor devices, windows for electrodes of 10.0 $\mu m \times 10.0$ $\mu m$, 50.0 $\mu m \times 50.0$ $\mu m$ and 100 $\mu m \times 100$ $\mu m$, were formed by etching with a perfluoro etching solution, and evaluation needles were attached to the electrode surfaces to evaluate the properties of the semiconductor devices. The semiconductor devices obtained in this Example, were found to undergo little change of the properties of the devices and have a high response speed as compared with conventional semiconductor devices having a single passivation film or a double layer passivation film formed. As passivation films, they have a low stress, low water absorptivity, acid resistance, alkali ion resistance and a low dielectric constant. Further, the etching rate in this case was from 1200 to 1500 Å/min. with FC-75 (room temperature).

EXAMPLE 7

Using the fluorine-containing polymer obtained in Preparation Example 3, a thin film having a thickness of 3000 Å, 5000 Å, 8000 Å, 1 $\mu m$ or 1.2 $\mu m$ was formed on a semiconductor device in the same manner as in Example 6.

An application of the above thin layer as an interlayer insulating film is shown in FIG. 5 in the accompanying drawings. FIG. 5 is an enlarged cross sectional view of the semiconductor device, wherein reference numeral 1 is a silicon substrate, numerals 2,3 and 4 indicate a buffer coat film, an α-ray shielding film and a passivation film, numerals 5 and 5' indicate interlayer insulating films made of the specific fluorine-containing polymer of the present invention, numerals 6 to 8 indicate the first to third metal patterning materials, numerals 9 and 10 indicate insulating films such as silicon oxide films, numerals 11 indicates an isolating insulating film, numeral 12 indicates a field effect transistor electrode 1, numeral 13 indicates a silicon electrode for a memory device, and numeral 14 indicates an insulating film for a memory device such as a silicon oxide film or a $Si_3N_4$ film.

The film thickness and the uniformity were evaluated by NANOSPEC*[1] and LAMBDA-ACE*[2], whereby it was confirmed to be an interlayer insulating film free from defects or irregularities in the film thickness to such an extent that is required for the preparation of a semiconductor device. In addition to the etching with a perfluoro etching solution, it was etched by plasma etching ($CF_4+O_2$, $CF_4+CHF_3+Ar$) or anisotropic (RIE)$_2$ etching at an etching rate of from 300 Å to 1.2 $\mu m$/min. After forming a pattern, Al and Si, and an Al+Cu+Si alloy, which are commonly employed, were used as interlayer patterning metal materials. The passivation film having two layered wiring metal materials coated was the same as in Example 6. The symbol marks *[1] an *[2] above and hereinafter indicate trade names for thin film measuring equipments.

EXAMPLE 8

Using the fluorine-containing polymer obtained in Preparation Example 3, a thin film having a thickness of 3000 ÅÅ, 5000 Å, 8000 Å, 1 $\mu m$ or 1.2 $\mu m$ was formed on a semiconductor device in the same manner as in Example 6 (see FIG. 5).

The film thickness and the uniformity were evaluated by NANOSPEC*[1] and LAMBDA-ACE*[2], whereby it was found to be an insulating film free from defects or irregularities in the film thickness to such an extent that is required for the preparation of a semiconductor device. In addition to etching with a perfluoro etching solution, it was etched by plasma etching ($CF_4+O_2$, $CF_4+CHF_3+AR$) or anisotropic (RIE) $O_2$ etching at an etching rate of from 3000 A to 1.2 $\mu m$/min. After forming a pattern, TiN and Si, a TiN+Al alloy, a TiN+TiW alloy and a TiW+A alloy, which are commonly used, were used as interlayer patterning metal materials. A passivation film having two patterning metal materials coated was the same as in Example 6.

EXAMPLE 9

Instead of a molding material (epoxy resin/silica filler) commonly used as an exterior sealing material, the fluorine-containing polymer obtained in Preparation Example 3 was employed. With respect to the semiconductor device thus obtained, PCT (pressure, cooker test, moisture resistance) was evaluated, whereby a good result was obtained in that little degradation in the properties due to the external stress was observed as compared with the conventional molding material. Yet, the sealing material in this Example had a very low dielectric constant and water absorptivity and thus is free from leading to a degradation of the properties of the semiconductor.

Further, when the sealing material of this Example is applied to EPROM, a window for erasing by ultraviolet rays, which used to be required with the conventional molding material, can be omitted, and it is possible to minimize the difference in the thermal expansion coefficient from the buffer coat film material. As a result, it is possible to prevent open failure of the bonding wire (e.g. an Au wire).

Further, in a large scale semiconductor or in a large scale semiconductor memory device, a defect reliefying or defective circuit-restoring technique is used in such a manner that the defect or defective circuit formed during the production is saved by switching to a redundancy circuit formed within the same chip. However, a fuse formed by a thin film such as a polycrystal silicon is used for the connection with the redundancy circuit and for the separation of the defective circuit. With the conventional passivation film, a buffer coat film or exterior sealing material had no light transmittance and was impossible of melting the thin film fuse of such polycrystal silicon. Whereas, by using the sealing material of the present invention having light transmitting properties, the fuse melting step which used to be essential prior to the formation of the passivation film, can now be conducted even after the formation of the exterior sealing film. Yet, the step which used to require a clean room can now be conducted free from such an environmental restriction.

In the present invention, a polymer having a fluorine-containing aliphatic cyclic structure is used as the starting material, whereby a protective film having a low water absorptivity, a low dielectric constant and excellent heat resistance, can readily be formed by coating, and it is possible to obtain a semiconductor integrated circuit device having a quick response speed with little erroneous operation. Further, it serves as a stress buffer against heat stress and mechanical stress and provides a high level of electrical insulating properties, moisture resistance, dry etching resistance, flatness and chemical resistance. Further, it provides a merit that the production cost of a semiconductor device can be reduced.

What is claimed is:

1. A semiconductor integrated circuit device having a protective film made of a polymer having as part of its molecular structure a fluorine-containing aliphatic cyclic structure obtained by cyclic polymerization or radical polymerization.

2. The semiconductor integrated circuit device according to claim 1, wherein the polymer is a polymer having the cyclic structure in its main chain, obtained by cyclic polymerization.

3. The semiconductor integrated circuit device according to claim 1, wherein the polymer is a polymer having the cyclic structure in its main chain, obtained by cyclic polymerization of a monomer having two carbon-carbon multiple bonds differing in the polymerizability in its molecule.

4. The semiconductor integrated circuit device according to claim 3, wherein the monomer is one having a straight chain portion of a linking chain connecting the two carbon-carbon multiple bonds of from 2 to 7 atoms.

5. The semiconductor integrated circuit device according to claim 1, wherein the polymer is a polymer having the cyclic structure in its main chain, obtained by cyclic polymerization of at least one monomer selected from the group consisting of a perfluoroallyl vinyl ether and a perfluorobutenyl vinyl ether.

6. The semiconductor integrated circuit device according to claim 1, wherein the polymer is a polymer having the cyclic structure in its main chain, obtained by radical polymerization of a cyclic monomer.

7. The semiconductor integrated circuit device according to claim 1, wherein the polymer is a polymer having the cyclic structure in its main chain, obtained by radical polymerization of perfluoro-2,2-dimethyl-1,3-dioxol.

8. The semiconductor integrated circuit device according to claim 1, wherein the polymer is a polymer having a fluorine content of at least 30% by weight.

9. The semiconductor integrated circuit device according to claim 1, wherein the polymer is a polymer containing at least 20 mol % of the cyclic structure.

10. A semiconductor integrated circuit device having a protective film according to claim 1, wherein the fluorine-containing aliphatic cyclic structure is of the formula wherein l is from 0 to 5, m is from 0 to 4, n is 0 or 1, provided that $l+m+n$ is from 1 to 6, and R is F or $CF_3$.

11. A semiconductor integrated circuit device having a protective film according to claim 1, wherein the fluorine-containing aliphatic cyclic structure is of the formula wherein each of o, p and q is from 0 to 5, provided $o+p+q$ is from 1 to 6.

12. A semiconductor integrated circuit device having a protective film according to claim 1, wherein the fluorine-containing aliphatic cyclic structure is of the formula wherein $R_1$ if F or $CF_3$, and $R_2$ is F or $CF_3$.

13. A semiconductor integrated circuit device having a protective film according to claim 1, wherein the fluorine-containing aliphatic cyclic structure is of the formula

14. A semiconductor integrated circuit device having a protective film according to claim 1, wherein the fluorine-containing aliphatic cyclic structure is of the formula

15. A semiconductor integrated circuit device having a protective film according to claim 1, wherein the fluorine-containing aliphatic cyclic structure is of the formula

16. A semiconductor integrated circuit device having a protective film according to claim 1, wherein the fluorine-containing aliphatic cyclic structure is of the formula

17. A semiconductor integrated circuit device having a protective film according to claim 1, wherein the fluorine-containing aliphatic cyclic structure is of the formula

18. A semiconductor integrated circuit device having a protective film according to claim 1, wherein the fluorine-containing aliphatic cyclic structure is of the formula

19. A semiconductor integrated circuit device having a protective film according to claim 1, wherein the fluorine-containing aliphatic cyclic structure is of the formula

20. A semiconductor integrated circuit device having a protective film according to claim 1, wherein the fluorine-containing aliphatic cyclic structure is of the formula

21. A semiconductor integrated circuit device having a protective film according to claim 1, wherein the fluorine-containing aliphatic cyclic structure is of the formula

22. A semiconductor integrated circuit device having a protective film according to claim 1, wherein the fluorine-containing aliphatic cyclic structure is of the formula

23. A semiconductor integrated circuit device having a protective film according to claim 1, wherein the fluorine-containing aliphatic cyclic structure is of the formula

* * * * *

UNITED STATES PATENT AND TRADEMARK OFFICE
CERTIFICATE OF CORRECTION

PATENT NO. : 5,117,272

DATED : May 26, 1992

INVENTOR(S) : Shinzou Nomura et al.

It is certified that error appears in the above-identified patent and that said Letters Patent is hereby corrected as shown below:

On the Title page, item [54],

The title is incorrect, should be, --SEMICONDUCTOR INTEGRATED CIRCUIT DEVICE HAVING A PROTECTIVE FILM OF A POLYMER HAVING A FLUORINE-CONTAINING ALIPHATIC CYCLIC STRUCTURE--.

Signed and Sealed this

Seventeenth Day of August, 1993

Attest:

BRUCE LEHMAN

Attesting Officer

Commissioner of Patents and Trademarks